United States Patent [19]

Ibrahim et al.

[11] Patent Number: 5,289,391
[45] Date of Patent: Feb. 22, 1994

[54] METHOD AND APPARATUS FOR OPTIMUM SIGNAL BURST DETECTION

[75] Inventors: Khalid M. Ibrahim, San Jose; William D. Bachalo, Los Altos Hills, both of Calif.

[73] Assignee: Aerometrics, Inc., Sunnyvale, Calif.

[21] Appl. No.: 833,338

[22] Filed: Feb. 10, 1992

[51] Int. Cl.$^5$ ............................................. G01R 29/027
[52] U.S. Cl. .................................... 364/570; 364/486; 375/75; 375/94
[58] Field of Search ............... 364/576, 486, 487, 517, 364/572, 574; 375/94; 329/311; 328/140; 307/519, 522; 340/825.63, 825.64, 825.57, 825.77, 825.78; 341/179

[56] References Cited

U.S. PATENT DOCUMENTS

| | | | |
|---|---|---|---|
| 3,504,164 | 3/1970 | Farrell et al. | 364/487 |
| 4,009,353 | 2/1977 | James et al. | 364/487 X |
| 4,309,772 | 1/1982 | Kloker et al. | 375/94 X |
| 4,375,102 | 2/1983 | Van Daal | 375/94 |
| 4,722,093 | 1/1988 | Tejima | 375/75 |
| 4,791,577 | 12/1988 | Winter | 364/487 X |
| 4,827,259 | 5/1989 | Murphy et al. | 364/487 X |
| 4,943,974 | 7/1990 | Motamedi | 375/1 |
| 5,067,090 | 11/1991 | Seeman | 364/486 |

Primary Examiner—Jack B. Harvey
Assistant Examiner—Eric W. Stamber
Attorney, Agent, or Firm—Blakely Taylor Sokoloff & Zafman

[57] ABSTRACT

The present invention provides a time efficient and practical method for signal burst detection. The signal is first applied to a set of linear transformations and input to a one-bit analog to digital converter and stored. The stored signal is then correlated with stored replications of sinusoidal wave forms over the range of frequencies using either a random access memory (RAM) or EPROM chip. The maximum of the correlation outputs is then compared with a selected threshold to provide a decision for the existence or nonexistence of the signal. This information is used to signal the processor to proceed with the acquisition and processing of the signal to determine the frequency and phase.

44 Claims, 12 Drawing Sheets

METHOD AND APPARATUS FOR OPTIMUM SIGNAL BURST DETECTION

BACKGROUND OF THE INVENTION

1. FIELD OF THE INVENTION

The present invention relates to the field of burst signal detection such as may be found in laser Doppler velocimetry, phase Doppler particle sizing, communications, and burst radar applications.

2. ART BACKGROUND

Reliable burst signal detection plays a very important role in the signal processing of burst signals for a wide range of applications. Specifically, in the application of the laser Doppler velocimeter (LDV) and the Phase Doppler Particle Analyzer (PDPA), short duration "Doppler burst" signals are produced when particles pass the intersection of two laser beams. These signals are characterized as consisting of a Gaussian beam intensity envelope or pedestal with a sine wave superimposed on it. The duration of the signal depends upon the particle velocity and the focused diameter of the beams at their intersection. These particle transit times can vary from milliseconds to only 100 nanoseconds or less. The amplitude of the signals will also vary over a wide range due to the range of particle sizes that may be involved in addition to the effects of passing on different trajectories through the Gaussian beam. Thus, the signal processing means must have a burst detection system that can handle a very wide dynamic range and that is very fast in its response.

Added to the difficulty of detecting the burst signal is the usual problem of low signal to noise ratio (SNR). In general, the LDV and PDPA will need to detect low amplitude signals and signals that have a very low SNR (as low as 0 dB). The SNR will also vary during the measurement routine and in the past, this has entailed careful setting of the detection level or threshold value, when operating the instruments.

Burst detectors that are based upon the signal amplitude and referred to generically as "time domain" burst detectors are frequently used. See, Van Tree H., "Detection, Estimation and Modulation Theory", New York, (Wiley 1968); Ibrahim K., Werthimer D. and Bachalo W., "Signal Processing Considerations for Laser Doppler and Phase Doppler Applications", Proceedings of the Fifth International Sumposion on Applications of Laser Techniques to Fluid Mechanics, Lisbon, Portugal, July 1990; Bachalo W., Werthimer D., Raffanti R. and Hermes R. "A High Speed Doppler Signal Processor for Frequency and Phase Measurement", Third International Conference on Laser Anemometry, Advances and Applications, September 1989. These devices act on the unfiltered signal or the high pass filtered signal and base the detection on the condition that the signal voltage must exceed a preset level (threshold) before the signal is considered present. A more advanced version of this method requires that each cycle in the burst signal cross a positive threshold voltage, pass through zero to a negative threshold voltage, and then the next zero voltage crossing of the signal is used in the signal period determination. However, this sequence must be repeated for each cycle in the burst for it to be accurately detected.

Time domain burst detectors have also used the average of the signal power over a certain period of time. In this approach, the signal is rectified or squared to maximize the signal amplitude while minimizing the relative affect of the noise. Unfortunately, these methods fail to work when the noise power becomes comparable to the signal power (i.e., SNR is close to 0 dB).

An optimum configuration for signal detection can be attained by using a correlation receiver in which the input signal r(t) consists of the signal component s(t) carrying the desired information plus noise n(t). In the absence of the desired signal, the input signal will only be the noise. Thus, with this configuration, the input signal r(t) is represented as either:

$$r(t) = s(t) + n(t) \tag{1}$$

when the signal s(t) exists, or $$r(t) = n(t) \tag{2}$$

for the case when the signal is absent.

The signal r(t) is correlated with a stored replica of the signal s(t) to be detected in the presence of noise n(t). In this special case, for the sake of example, the signal characteristics are known. The correlator output is then compared with a certain threshold to provide a decision for the existence or non existence of the signal s(t).

For laser anenometry, the signal s(t) could be a member of an orthogonal set of sinusoidal waveforms (that is, the correlation between two sinusoidal waves are zero unless the frequencies are equal). To cover the range of frequencies of interest requires that the signal be correlated with a predetermined number of signals, m, in the manner described for the single signal. A burst detector configuration will include a correlator for correlating the signal with a set of sinusoidal waveforms of different frequencies. The maximum of the correlator outputs is then selected and compared with a certain threshold to decide whether or not the signal exists.

For example, in one implementation, the input signal is sampled with an analog to digital convertor (ADC). This changes the continuous signal to a set of discrete samples. A discrete Fourier Transform (DFT) is then performed. The series of sinusoidal waves $s_m(t)$ are correlated with the input signal by taking discrete sampled values of $s_m(t)$ represented as $s_m(i)$. The index i will range from 0 to N−1, where N is the number of samples acquired over the Discrete Fourier Transform.

For the evaluation of the burst detector, two metrics of merit are introduced. The first one is the acceptance rate (A). This metric is introduced for system evaluation in the presence of the signal (i.e., r(t)=s(t)+(t)). It is defined as the probability of signal detection provided that the signal exists. The second metric is the false detection rate (R). This metric is introduced for system evaluation in the absence of the signal. It is defined as the probability of false detection (assuming that the signal does not exist (i.e., r(t)=n(t)).

In the following, the performance of the above configuration that uses the discrete sampled data is analyzed. For the purpose of the analysis, let r(i) (where $0 \leq i < N$) represent the discrete sampled data for the signal r(t). Thus, the discrete samples r(i) can be written as $$r(i) = s(i) + n(i) \tag{3}$$

$$r(i) = n(i) \tag{4}$$

for the case of signal existence or absence respectively.

The DFT for discrete sampled data is then given by $$S(k) = \sum_{i=0}^{N-1} r(i)e^{-j\pi ik/N} \quad (5)$$

where $0 \leq k, i < N$.

The power at the k-th bin is then given by:

$$S(k) = \left[\sum_{i=0}^{N-1} r(i)\sin(2\pi ik/N)\right]^2 + \left[\sum_{i=0}^{N-1} r(i)\cos(2\pi ik/N)\right]^2 \quad (6)$$

Two expressions for S(k) will be derived. The first is derived when the signal does not exist (i.e., $r(i) = n(i)$). The second is derived when the signal exists (i.e., $r(i) = s(i) + n(i)$). These two expressions will then be used to compute the acceptance and the false detection rates.

Consider first, the case of the signal absence (i.e., $r(i) = n(i)$). For this case equation (6) becomes, $$S(k) = \left[\sum_{i=0}^{N-1} n(i)\sin(2\pi ik/N)\right]^2 + \left[\sum_{i=0}^{N-1} n(i)\cos(2\pi ik/N)\right]^2 \quad (7)$$

Assuming that the n(i) and n(j) to be uncorrelated for $i \neq j$ (i.e., the noise is white) then using the central limit theorem, the terms $$Q(k) = \sum_{i=0}^{N-1} n(i)\sin(2\pi ik/N) \text{ and } C(k) = \sum_{i=0}^{N-1} n(i)\cos(2\pi ik/N)$$

can be considered to be a Gaussian random variable. Let the mean and the variance of n(i) respectively be 0 and $\sigma^2$ (i.e. the noise is of zero mean and power of $\sigma^2$). The mean and the variance of the terms Q(k) and C(k) will therefore be zero and $N\sigma^2/2$, respectively. Thus, the term S(k) or equation (7) can be considered to be a random variable of chi square statistic with 2 degrees of freedom. Furthermore, the probability density function for S(k) is given by:

$$p(S(k) = y) = \frac{1}{N\sigma^2} e^{-\frac{y}{N\sigma^2}} \quad (8)$$

where $y \geq 0$.

For a certain threshold Th in the power spectra, the probability that any of the S(k)'s below that threshold is then given by:

$$P(S(k) < Th) = \int_0^{Th} \frac{1}{N\sigma^2} e^{-\frac{y}{N\sigma^2}} dy \quad (9)$$

or $$P(S(k) < Th) = 1 - e^{-\frac{Th}{N\sigma^2}} \quad (10)$$

Thus, the probability that all the S(k)'s do not exceed that threshold is then given by:

$$P(\text{all } S(k)\text{'s less than } Th) = [1 - e^{-\frac{Th}{N\sigma^2}}]^{N/2} \quad (11)$$

The false detection rate can be then written as:

$$R(Th) = 1 - [1 - e^{-\frac{Th}{N\sigma^2}}]^{N/2} \quad (12)$$

For $(Th/N\sigma^2)$ greater than 1, the above equation can be approximated to:

$$R(Th) = \frac{N}{2} e^{-\frac{Th}{N\sigma^2}} \quad (13)$$

As it can be seen, the rejection rate R(Th) is dependent on the noise level. By changing the noise power, the threshold should be changed to maintain the same rejection rate.

In the following discussion, the relationship for finding the power spectra for the case of signal existence is established. For this case, $r(i) = s(i) = n(i)$, and equation (6) can be written as:

$$S(k) = \left[\sum_{i=0}^{N-1} \{s(i) + n(i)\}\sin(2\pi ik/N)\right]^2 + \left[\sum_{i=0}^{N-1} \{s(i) + n(i)\}\cos(2\pi ik/N)\right]^2 \quad (14)$$

Let s(i) be equal to $M \sin(2\pi im/N)$, (i.e., the signal is a discrete sampled sinusoidal wave of frequency $mf_s/N$ where $f_s$ is the sampling frequency). Thus, the signal frequency corresponds to the discrete frequency m in the DFT), and the power at the m-th bin is given by:

$$S(m) = \left[\sum_{i=0}^{N-1} \{M\sin(2\pi im/N) + n(i)\}\sin(2\pi im/N)\right]^2 + \left[\sum_{i=0}^{N-1} \{M\sin(2\pi im/N) + n(i)\}\cos(2\pi im/N)\right]^2 \quad (15)$$

The above equation can be simplified as:

$$S(m) = \frac{(MN)^2}{4} + M^2\left\{\left[\sum_{i=0}^{N-1} \frac{n(i)}{M}\sin(2\pi im/N)\right]^2 + \left[\sum_{i=0}^{N-1} \frac{n(i)}{M}\cos(2\pi im/N)\right]^2 + \left[N\sum_{i=0}^{N-1}\frac{n(i)}{M}\sin(2\pi im/N)\right]\right\} \quad (16)$$

For the case where $$\sum_{i=0}^{N-1} \frac{n(i)}{M}\sin(2\pi ik/N) > \sqrt{N}$$

(this condition is generally satisfied for low SNR less than 10 dB), the above equation can be rewritten as:

$$S(m) = \frac{(MN)^2}{4} + M^2\left\{\left[\sum_{i=0}^{N-1}\frac{n(i)}{M}\sin(2\pi im/N)\right]^2 + \left[\sum_{i=0}^{N-1}\frac{n(i)}{M}\cos(2\pi im/N)\right]^2\right\} \quad (17)$$

Therefore, S(m) can be approximated by a d.c. value $(MN)^2/4$ added to the second term. As it is shown earlier, the second term can be considered as a random variable of chi square distribution given by:

$$\frac{1}{N\sigma^2} e^{-\frac{y}{N\sigma^2}}$$

Thus, it is shown that the power spectra of the noise will have a chi squared distribution. A formula for the false detection of noise was derived (equation(13)). Then it was shown that for the case of the signal plus noise $(r(t)=s(t)+n(t))$, the power spectra was composed of two components (equation(17)). The first component is due to the power spectra of the signal without the noise whereas the second was due to the noise and had a chi squared distribution. In general, the power in the bin corresponding to the signal frequency is greater than $(MN)^2/4$. An initial crude selection of a signal detection threshold Th in the power spectra to be a value equal to $(MN)^2/4$ would ensure signal detection. With this value substituted into equation (13), the false detection rate would be given by:

$$R(Th) = \frac{N}{2} e^{-\frac{M^2N^2}{4N\sigma^2}} \quad (18)$$

or $$R(Th) = \frac{N}{2} e^{-N(SNR)/2} \quad (19)$$

Although the above method provides optimum performance for signal detection, it is an impractical method for two reasons.

First, it requires intensive computation. Thus its implementation requires complex circuitry and is only limited to low frequency with long burst applications. In addition, the threshold selection for optimum performance is dependent on the signal level and the noise level. Thus, the threshold should be changed every time any of these parameters is changed.

In the present invention, a frequency domain burst detector will be described. The burst detector is capable of detecting signals at very low SNR, utilizing minimal computational overhead, and does not require frequent settings of a threshold level which is set based on the signal to noise ratio in the frequency domain rather than on the amplitude.

SUMMARY OF THE INVENTION

The present invention provides an optimum and practical method for signal burst detection, and one that does not require careful setting and calibration by the user. The signal is first applied to a set of linear transformations and input to a one-bit analog to digital converter and stored. The stored signal is then correlated with stored replications of sinusoidal wave forms over the range of frequencies stored in memory. The maximum of the correlation outputs is then compared with a selected threshold to provide a decision for the existence or nonexistence of the signal. This information is used to signal the processor to proceed with the acquisition and processing of the signal to determine the frequency and phase.

BRIEF DESCRIPTION OF THE DRAWINGS

The objects, features and advantages of the present invention will be apparent from the following detailed description in which:

FIG. 2 illustrates the presentation of possible 16 bit patterns as a binary sequence of 1's and 0's.

| | DEFINITIONS |
|---|---|
| $s(t)$ | signal component that carries the desired information |
| $n(t)$ | additive noise component |
| $r(t)$ | input signal (it is equal to $s(t) + n(t)$ if the signal exists and it is equal to $n(t)$ if the signal dose not exist) |
| $r_i(t)$ | output of the i-th linear transformation (see FIG. 5) |
| $s(i)$ | discrete sampled data of $s(t)$ |
| $n(i)$ | discrete sampled data of $n(t)$ |
| $r(i)$ | discrete sampled data of $r(t)$ |
| N | number of the samples used for the Discrete Fourier Transform (DFT) |
| Q(k) | Imaginary part of the DFT of $r(i)$ at the discrete frequency k |
| C(k) | Real part of the DFT of $r(i)$ at the discrete frequency k |
| S(k) | Power of the DFT of $r(i)$ at the discrete frequency k (equals to $Q^2(k) + C^2(k)$) |
| Th | Threshold in the power spectrum |
| $\sigma^2$ | Noise power |
| p(x) | Probability density function of x |
| P (S(k)<Th) | Probability that S(k) is less than Th |
| M | Amplitude of the signal $s(t)$ |
| SNR | signal to noise ratio |
| fs | sampling frequency |
| $T_s$ | $1/f_s$ |
| E[x] | Expected value of random variable x |
| var[x] | Variance of the random variable x |
| q | Q-E[Q] |
| c | C-E[C] |
| o(i) | sign of $s(i) + n(i)$ |
| $\gamma$ | random variable (it is equal to 1 if $n(i) < 0$ and is equal to 0 if $n(i) \geq 0$). |
| T | Measurement time |
| $T_s$ | Time slot for the Doppler signal within the time T |
| $T_i$ | Transit time for the individual Doppler burst i |
| $T_n$ | Time slot for the noise within the time T |
| $D_{processed}$ | Number of the Doppler bursts processed by the processor within the time T |
| $D_{Doppler}$ | Number of the actual Doppler bursts within the |

-continued

| | DEFINITIONS |
|---|---|
| | time T |
| $T_p$ | time required to process the data collected by a single triggering of the burst detector |
| $\alpha$ | number of burst detector attempts within one burst |

DETAILED DESCRIPTION OF THE INVENTION

An apparatus and method for detecting burst signals even under conditions of low SNR (as low as 0 dB) using a frequency domain method will be described. In the following description for purposes of explanation, numerous details and mathematical analysis are set forth such as the mathematical formulation of the approach, the discrete Fourier transform (DFT), the decoding circuitries that may be used, and the approach for setting SNR threshold in the frequency domain in order to provide a thorough understanding of the present invention. However, it will be apparent to one skilled in the art that the invention may be practiced without these specific details. In other instances, well-known components, structures and electronics processing means have not been described in detail in order to not obscure the present invention unnecessarily.

Figure 1:
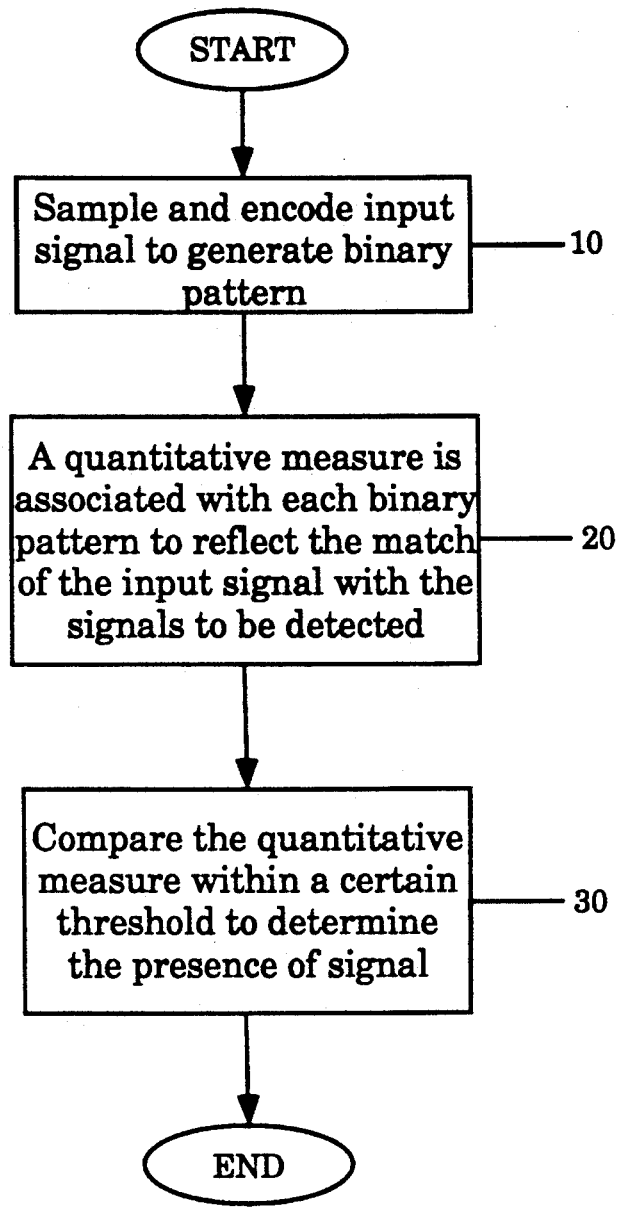
FIG. 1 is a flow chart illustrating a preferred embodiment of the process of the present invention.

A simplified diagram of the process of the present invention for burst detection is illustrated by the flow chart of FIG. 1. At step 10, the input signal is decoded into a sample stream of 1-bit data, preferably by a 1-bit digitizer (where the output is logic one when the signal is greater than zero and logic zero when the signal is less zero). Other types of 1-bit decoders will be described in the following discussion. At step 20, a quantitative measure is associated with all the possible patterns that can be produced by the 1 bit decoder. The quantitative measure is precomputed for all possible binary patterns and loaded into memory (or other mapping means) to provide that measure for each possible pattern. The quantitative measure is determined based on certain criteria that determine the match between the incoming signal and the signal (or signals) to be detected. An example of a quantitative measure is the Fourier analysis. As was discussed previously, the use of the Fourier analysis provides an optimum criterion for signal detection for the case of detecting sinusoidal waveforms in the presence of noise; however, other quantitative measures may be utilized to determine a match between the incoming signal and the signal to be detected. An alternate, but simple, example, for the quantitative measure of the match between the input signal and the signal to be detected is the hamming distance between the binary pattern that represents the input signal with the binary patterns of the signal to be detected. (The hamming distance is defined as the number of similar binary bits in the two binary patterns of interest.)

Figure 2:
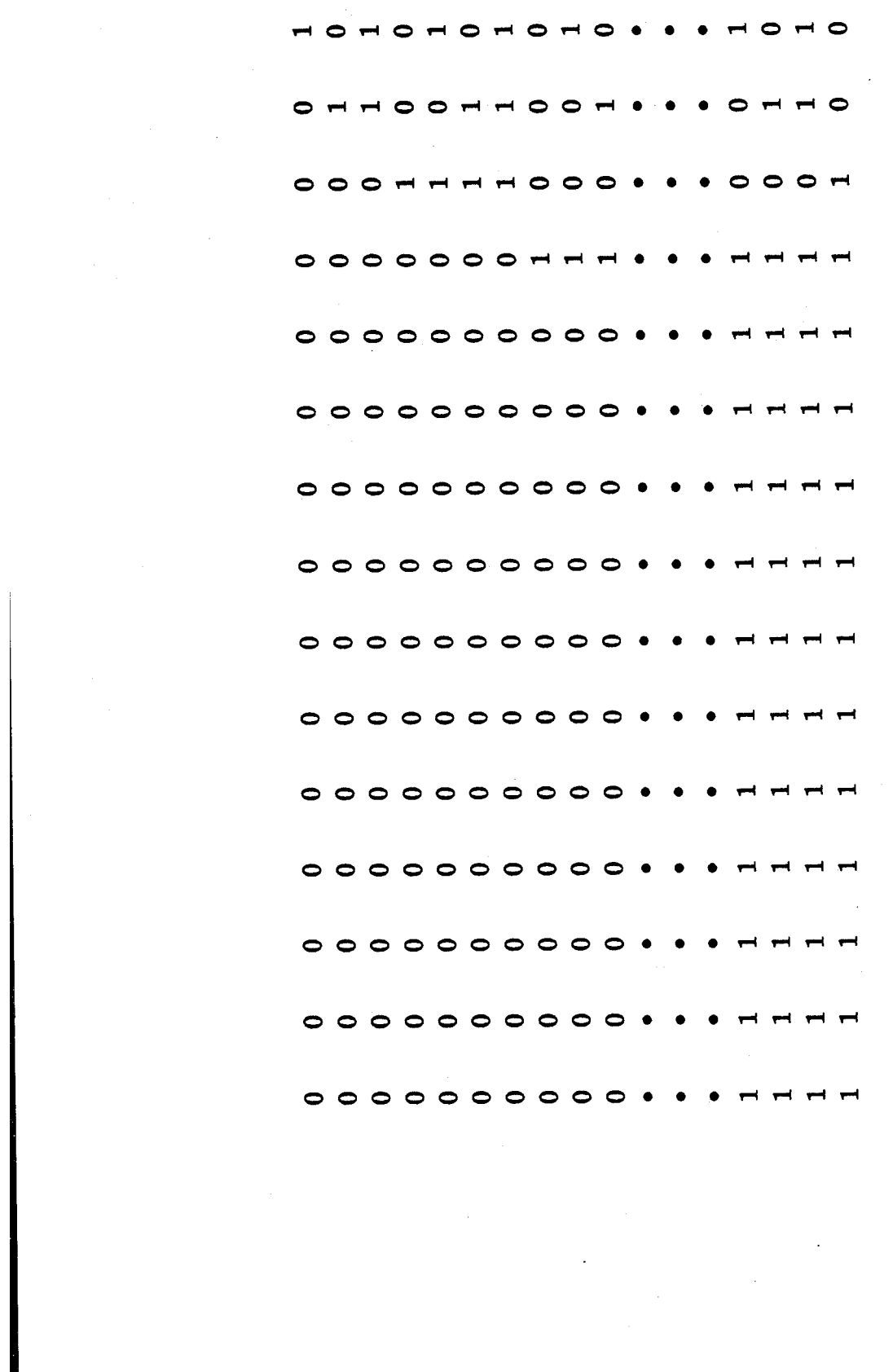

At step 30 the quantitative measure determined is compared with a certain threshold to determine the existence or nonexistence of the signal. The number of samples taken when the input signal is decoded should be sufficient to identify the presence of a signal but not too large that the efficiency of the system is compromised. Preferably 16 samples are taken for each determination of the presence of the signal. If 16 bits are used per test for the presence of the signal, then all the possible patterns produced by 16 bits may be easily stored in a reasonable amount of memory. Referring to FIG. 2, as the number of possible different patterns stored in memory equals $2^{16}$ or 64K, a match between the sampled input signal and the sinusoidal waveforms (to be detected) may be simply determined by comparing the quantitative measure associated with the binary representation of the input signal and a certain threshold to decide on the existence or nonexistence of the signal.

Figure 3A:
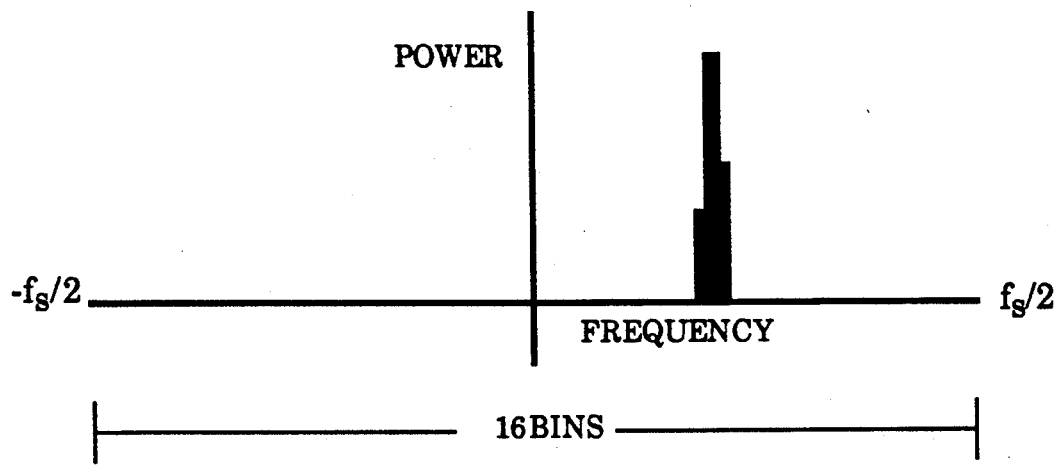
FIG. 3a and 3b visually depict typical power levels and distributions respectively for a coherent signal and noise signal.
Figure 3B:
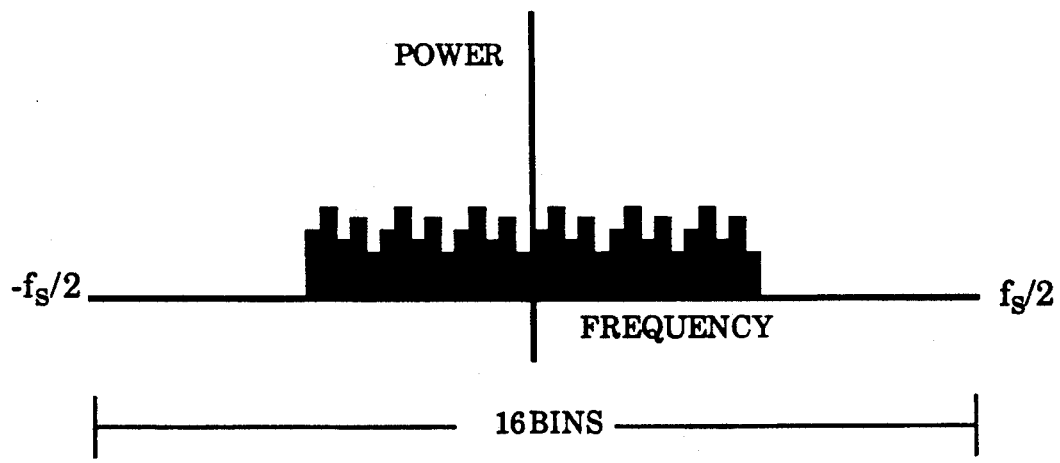

Memory, logic circuitry or other decoding means can be used to provide the quantitative measure associated with each of the $2^{16}$ possible binary patterns of 1's and 0's. It is preferred, however, that the sampled input signal of binary 1's and 0's is used as a memory address for accessing the corresponding power level information computed using the Fourier analysis. The power level information is then utilized to determine the existence or non-existence of a signal. Preferably, the power level information stored is proportional to the power of the frequency bin having the maximum power computed with the discrete Fourier transform. This is illustrated by FIG. 3a. FIG. 3a is a plot of the frequency versus the power level for a sampled coherent signal waveform. As the signal reflects coherency, the power level is concentrated around the signal frequency. If the signal reflected solely random noise, the plot of the power versus frequency would look like that of FIG. 3b in which the power levels are much lower and distributed across the bins.

Figure 4:
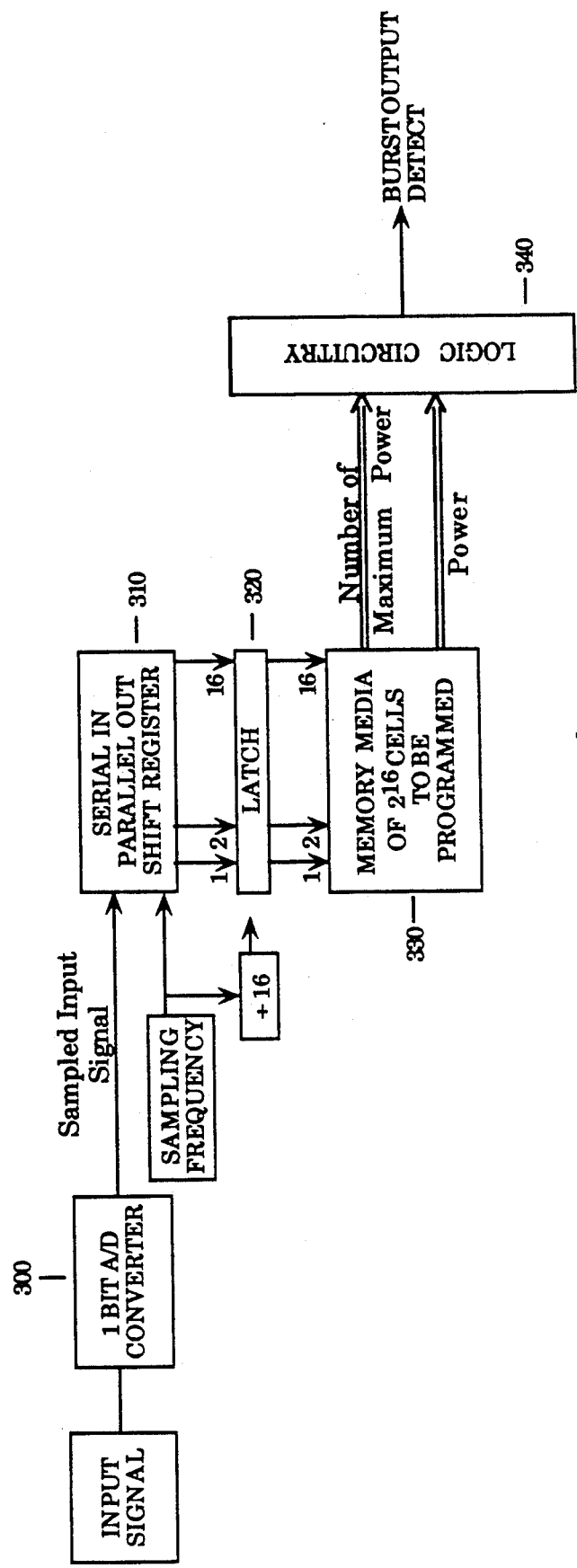
FIG. 4 is a simple block diagram representation of a burst detector of the present invention.

FIG. 4 shows a simplified diagram for the burst detector of the present invention. In this diagram, the input signal is sampled using 1 bit analog to digital convertor 300 to produce a sampled input signal of zeros (0's) and ones (1'). The sampled bits are input to a shift register 310 and then to a latch 320 which temporarily stores each of the 16 bits of the sampled input waveform. The acquired 16 samples of 0's and 1's are used as the address to read data from a large memory device 330. The memory device 330 has $2^{16}$ memory locations with addresses represented by the 16 bit binary representation of the numbers from 0 to $2^{16}-1$. Each memory location or cell contains information about the particular pattern of the 1's and 0's which correspond to the sampled voltage signal and/or noise. The information in each memory cell is proportional to the power of the frequency bin having the maximum power computed according to the discrete Fourier transform for that pattern. Preferably, the discrete Fourier transform of all binary representation of the numbers from 0 to $2^{16}-1$ are precalculated and loaded into the respective memory locations. Alternatively, each memory location may not only contain the power but also an estimate of the signal frequency which may be utilized for subsequent processing. The information regarding the input signal frequency can be further used to limit signal detection over a limited range of frequencies. By utilizing the input signal frequency the false detection rate can be reduced and signals of frequencies that do not belong to the frequency range of interest can be rejected.

The burst signal is detected in the logic circuitry 340 by comparing the power stored in the memory location addressed by the sampled input signal with a predetermined threshold power level. If the power in the memory location addressed exceeds the threshold level which has been determined to be indicative of a signal, a signal that has a periodic nature (including dc voltages) exists.

There are at least two possible approaches for implementing the method. In the first approach, the power or a number proportional to the power computed with the discrete Fourier transform for that address (i.e., the binary representation of the number of the memory cell) is compared with a selectable threshold level.

In the second approach, the memory device such as a RAM is loaded with just 1's and 0's in the memory locations. The 1's and 0's in the memory locations correspond to a 1 when the power is greater than a selected threshold level and 0 when it is below the threshold level. To change the threshold selection, the memory device is reloaded with 1's and 0's corresponding to the new threshold level selected.

It should be noted that with only 16 points and a significant noise background, the probability of false signal detection (interpreting noise as a coherent signal) may not be zero. Although the probability of detecting noise is varied and is dependent upon the selection of the threshold value, it can be generalized that the probability will be greater than 1/64000 and may be estimated for illustration purposes to be 100/64000. If, for example, a sampling frequency of 160 MHz is used, then there will be $10^7$ decisions per second (this corresponds to the rate of acquiring sixteen samples). Thus, there is a probability for $10^7 \times 100/64000$ false detections per second. This implies that there would be as many as 15000 false detections per second, which is on the order of the highest data rate that may be expected in practical applications.

In one embodiment, the false detection rate can be reduced by detecting the presence of a signal only after a predetermined number of consecutive samples exceeds the threshold value. Alternately, the problem of having a high false detection rate due to the use of a limited number of bits (say N) can be overcome by using a more general configuration. This configuration allows parallel and consecutive decisions over blocks of N bits. Preferably, the decisions over these blocks are statistically independent. Then the overall system false detection rate will be equal to the multiplication of the false detection rate of each of these blocks. This effectively reduces the false detection rate.

Figure 5:
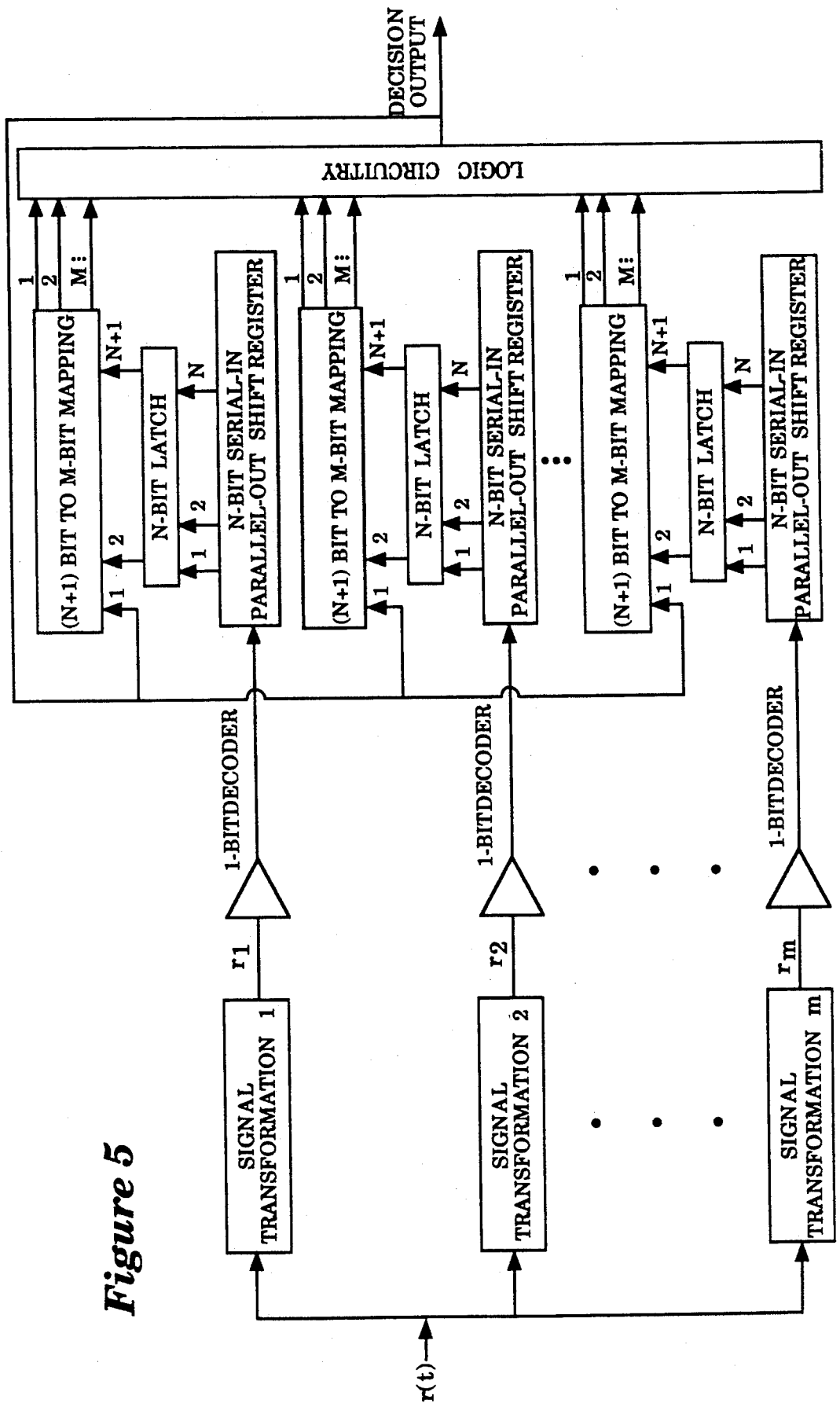
FIG. 5 illustrates a general configuration of the burst detector of the present invention.

FIG. 5 shows a possible implementation for the configuration described above. In this figure, the input signal r(t) is applied to a set of signal transformation 1,2 ..., m. Let the output of these signal transformations be denoted as $r_1, r_2 \ldots, r_m$. The signal transformations are selected such that the signals $r_1, r_2 \ldots$ and $r_m$ preserve the signal characteristics of r(t) in case of the signal presence, while $r_1, r_2 \ldots r_m$ are statistically independent in case of signal absence. To detect a sinusoidal wave in the presence of noise, a signal transformation is used such that the outputs $r_1, r_2 \ldots$ and $r_m$ satisfy the following conditions:

$$E[r_i r_j] = 0 \text{ for } i,j = 0,1, \ldots, m, i \neq j \quad (1)$$

This is sufficient to insure that the signals $r_1, r_2 \ldots, r_n$ preserve the coherency of the signal r(t) in the case of signal presence. Furthermore, in case of the Gaussian white noise, the signals $r_1, r_2 \ldots r_n$ are statistically independent.

Figure 6:
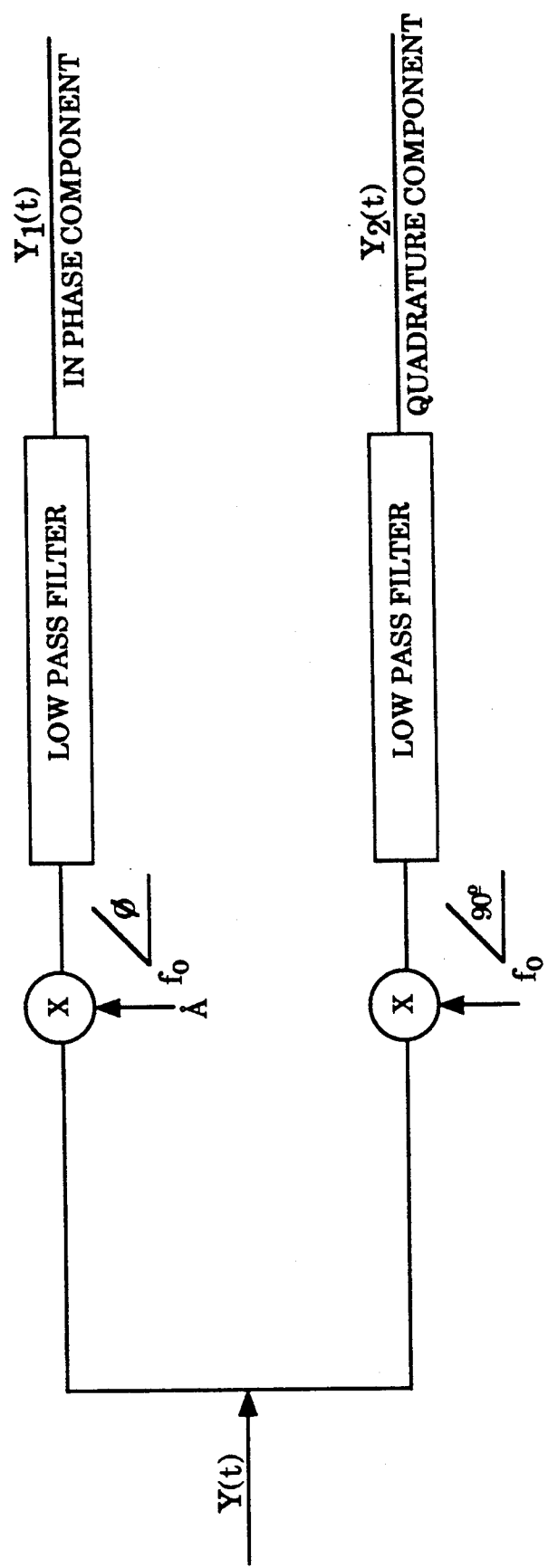
FIG. 6 is a block diagram illustration of an implementation for a linear transformation employed in the preferred embodiment of the present invention.

FIG. 6 shows a practical implementation for the linear transformations described above. In this example, the input signal Y(t) is split using a two way signal splitter. The first splitter output is mixed with a local oscillator of frequency $f_o$ and the second splitter output is mixed with the same oscillator output after being shifted by 90 degrees. Thus, the signal $Y_2(t)$ is the Hilbert transform of the signal $Y_1(t)$. This implies that the signals $Y_1(t)$ and $Y_2(t)$ satisfy the previous condition specified by (1). (For further information see Frederic de Coulon, "Signal Theory and Processing," (Artech House Inc., 1986), pp. 213-252.)

Referring back to FIG. 5, each of the outputs $r_i$ is fed to a 1-bit encoder to provide a stream of bits that are efficiency related to important features of the input signals $r_i$'s. For the case of a sinusoid, a 1-bit quantization sampler can be efficiently used as a 1-bit encoder. (This is due to the fact that the zero crossing are efficiently related to the frequency and the phase of the sinusoidal waveform.)

Figure 7:
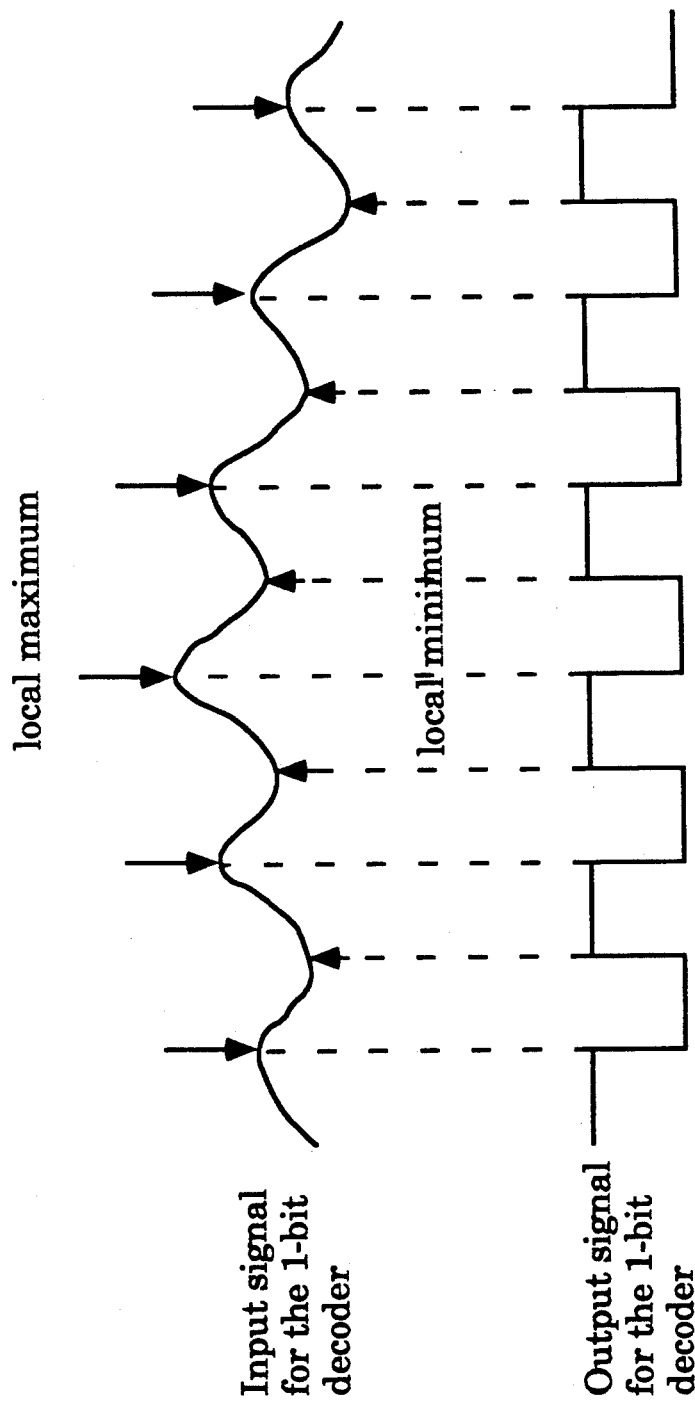
FIG. 7 illustrates an alternative method for 1-bit decoding.

Another type of 1-bit encoder is illustrated by FIG. 7. In this encoder, digital and/or logic circuits are used to detect the existence of local maximums and local minimums in the signal. For each detection of a local maximum, the encoder output is changed from logic one to logic zero. For each detection of a local minimum, the encoder output is changed from logic zero to logic one.

Referring to FIG. 5, the stream of binary 1's and 0's output by the 1-bit encoder is fed to a N-bit serial-in parallel out shift register. The register output is then latched and fed together with the overall system output into a mapping means from which generates an M-bit value. It should be noted that other means for generating input to the mapping circuits are possible. For example, multiple mapping means may be employed or configured to receive as input the in-phase or quatrature signals of the quadrature sampled input signal. The n M-bit outputs are then fed to a logic circuit for the decision of the existence or the absence of the signal.

Figure 8:
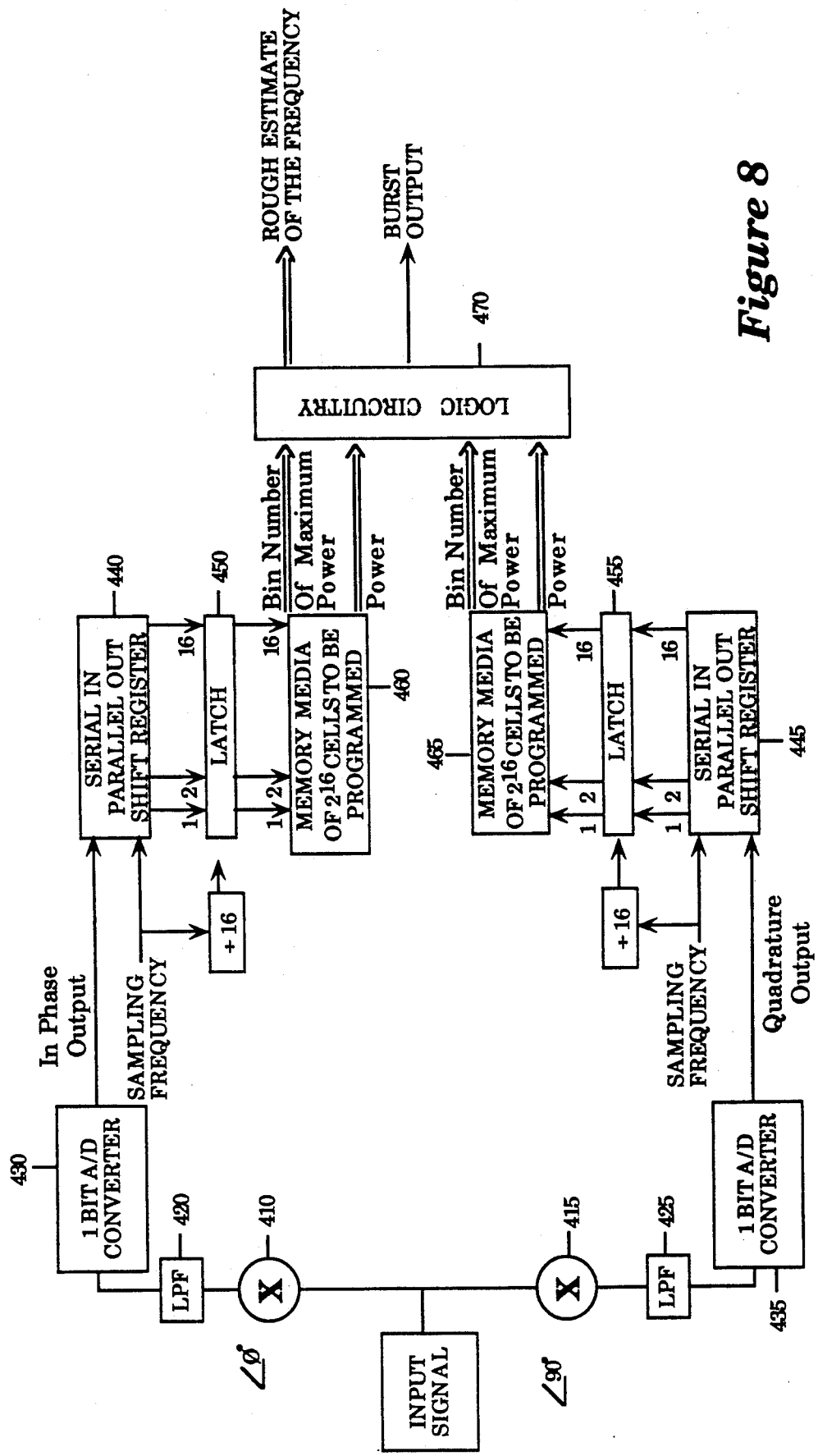
FIG. 8 is a block diagram representation of a preferred embodiment of the burst detector of the present invention in which in-phase and quadrature samples of the input signal are used.

The configuration of FIG. 5 can be implemented in different ways. FIG. 8 shows one possible implementation. In this implementation, the input signal is split. The first splitter output is applied with an output of a local oscillator (not shown) to a mix 410. The second splitter output is applied with an output of the same local oscillator shifted by 90 degrees to a mixer 415. Mixer outputs are then filtered using the low pass filters 420 and 425. The filter outputs (i.e., the in-phase and the quadrature components of the input signal) are then sampled using the one-bit A/D converters 430 and 435 to provide the in-phase and quadrature components, respectively. With the use of the in-phase and quadrature sampling process a lower false detection rate can be achieved. The in-phase and quadrature outputs are fed to the registers 440 and 445 and latched using components 450 and 455. The latch outputs are then used to address memories 460 and 465 to acquire the information regarding the power for the in phase and the quadrature components for the sampled input signal. The logic circuitry 470 utilizes the outputs of the memories 460, 465 for the in-phase and quadrature power values which are individually compared to the threshold value. A requirement that both the in phase and the quadrature signals (referred to as I and Q) pass the threshold criteria results in significant reduction of false detection rate. Further reduction can be achieved when a predetermined number of consecutive quadrature samples exceeds the threshold value.

For a quantitative measure of the performance of the preferred embodiment of the burst detector of the present invention, the following discussion provides a detailed analysis. Since 1 bit sampling is adopted, the r(i)'s (in equation(2)) are substituted by 1 or −1 depending on whether r(i) is greater or less than zero. For the case of signal absence, S(k) can be written as:

$$S(k) = \left[\sum_{i=0}^{N-1} (-1)^\gamma \sin(2\pi ik/N)\right]^2 + \quad (2)$$

$$\left[\sum_{i=0}^{N-1} (-1)^\gamma \cos(2\pi ik/N)\right]^2$$

where $\gamma$ is a random variable having a value of zero or one depending on whether $n(t)$ is greater or less than zero. As in the previous section, the terms $$\sum_{i=0}^{N-1} (-1)^\gamma \sin(2\pi ik/N)$$

and $$\sum_{i=0}^{N-1} (-1)^\gamma \cos(2\pi ik/N)$$

can be considered as a Gaussian random variables with zero mean and variance $N/2$. Following the steps as set forth earlier, the false detection rate may be written as:

$$R(Th) = 1 - [1 - e^{-\frac{Th}{N}}]^{N/2} \quad (21)$$

For $N/Th$ greater than 1 the above equation can be written as:

$$R(Th) = \frac{N}{2} e^{-\frac{Th}{N}} \quad (22)$$

As can be seen from the above equation, the false detection rate is independent of the noise level. The false detection rate is only dependent on the threshold value in the power spectra and the number of samples used for the DFT. Thus, by changing the noise level there is no need to change the threshold in order to keep a fixed false detection rate (as in the case of the prior art multi-bit optimum scheme).

In the following discussion, the relationship for finding the power spectra for the case of signal existence is established. For this case (i.e., $r(i)=s(i)+n(i)$), equation (14) can be rewritten as:

$$S(k) = \left[\sum_{i=0}^{N-1} \text{sign}[s(i) + n(i)]\sin(2\pi ik/N)\right]^2 + \quad (23)$$

$$\left[\sum_{i=0}^{N-1} \text{sign}^\gamma[s(i) + n(i)]\cos(2\pi ik/N)\right]^2$$

The quantity $o(i)=\text{sign}[s(i)+n(i)]$ can be considered as a random variable that has two values (1 and $-1$). The mean of this random given by:

$$E[o(i)] = P[o(i)>0] - P[o(i)<0] \quad (24)$$

or $$E[o(i)] = \int_{-s(i)}^{\infty} p(x)dx - \int_{-\infty}^{-s(i)} p(x)dx \quad (25)$$

For Gaussian noise, the above quantity can be reduced to:

$$E[o(i)] = G_\sigma(-s(i), \infty) - G_\sigma(-\infty, -s(i)) \quad (26)$$

or $$E[o(i)] = 2G_\sigma(0, s(i)) \quad (27)$$

where, $$G_\sigma(0,a) = \frac{1}{\sigma\sqrt{2\pi}} \int_0^a e^{-\frac{x^2}{2\sigma^2}} dx \quad (28)$$

Since $$\frac{1}{\sigma\sqrt{2\pi}} \int_0^a e^{-\frac{x^2}{2\rho^2}} dx = \frac{1}{\sqrt{2\pi}} \int_0^{\frac{a}{\sigma}} e^{-\frac{y^2}{2}} dy \quad (29)$$

the quantity $G_\sigma(0a)$ can be rewritten as:

$$G_\sigma(0,a) = G_1\left(0, \frac{a}{\sigma}\right) \quad (30)$$

It is clear that the above quantity is only dependent on the ratio $(a/\sigma)$.
Furthermore, the variance of the radom variable $o(i)$ is given by:

$$\text{var}[o(i)] = \quad (31)$$

$$\left[1 - 2G_1\left(0, \frac{s(i)}{\sigma}\right)\right]^2 G_1\left(-\frac{s(i)}{\sigma}, \infty\right) +$$

$$\left[1 + 2G_1\left(0, \frac{s(i)}{\sigma}\right)\right]^2 G_1\left(-\infty, \frac{s(i)}{\sigma}\right)$$

Therefore, in Equation (23), the quantities Q and C can be written as $$Q=E[Q]+q \quad (32)$$

and $$C=E[C]+c \quad (33)$$

where Q is a Gaussian random variable of mean given by E[Q], where, $$E[Q] = \sum_{i=0}^{N-1} 2\sin(2\pi im/N)G_1\left(0, \frac{s(i)}{\sigma}\right) \quad (34)$$

and the variance of Q equals var[q] and is given by V where $$V = \sum_{i=0}^{N-1} \sin^2(2\pi im/N)\text{var}[o(i)] \quad (35)$$

Similarly, C is a Gaussian random variable of mean given by E[C], where, $$E(C) = \sum_{i=0}^{N-1} 2\cos(2\pi im/N) G_1\left(0, \frac{s(i)}{\sigma}\right) \quad (36)$$

and the variance of C equals var[c] and is given by U where $$U = \sum_{i=0}^{N-1} \cos^2(2\pi im/N)\text{var}[o(i)] \quad (37)$$

Thus, Equation (23) can be rewritten as:

$$S(k)=[E[Q]+q]^2+[E[C]+c]^2 \quad (38)$$

For $s(i)=M \sin(2\pi im/N)$ (i.e., the signal is a discrete sampled sinusoidal wave of frequency $mf_s/N$ where $f_s$ is the sampling frequency and the signal frequency corresponds to the discrete frequency m in the DFT), then the above equation is reduced to:

$$S(k)=[E[Q]+q]^2+c^2 \quad (39)$$

and the expected value of S(k) is given by:

$$E[S(K)]=E[Q]^2+V+U \quad (40)$$

or $$E[S(k)] = \left[\sum_{i=0}^{N-1} 2\sin(2\pi im/N) G_1\left(0, \frac{s(i)}{\sigma}\right)\right]^2 + U + V \quad (41)$$

For N sufficiently large, the above quantity can be reduced to:

$$E[S(m)] = 2[NG_1(0, \sqrt{2SNR})]^2 + U + V \quad (42)$$

Thus, for a certain probability of signal detection, the threshold is dependent only on the SNR. Furthermore, the false detection rate is only dependent on the threshold unlike the multibit optimum signal detector scheme wherein the signal detection probability is dependent on the signal level as well as the SNR. Using the multibit scheme, the false detection rate is proportional to the noise level. Thus, the threshold level must be changed every time the signal level or the noise level is change. On the other hand, for the 1 bit signal detection scheme of the present invention, the threshold level needs to be adjusted only for the minimum expected SNR. This is a very important distinction as it significantly minimizes the complexity of the burst detection apparatus and process for implementing the same.

Figure 9:
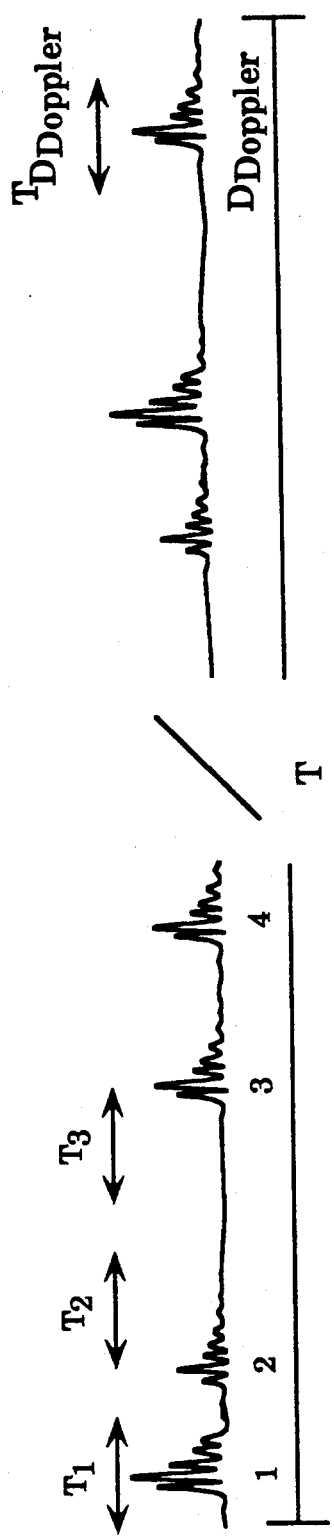
FIG. 9 is an illustration of a typical Dopler Burst signal.

The threshold level will be selected to maximize the number of the processed signals per unit time T. FIG. 9 shows a typical stream LDV signals over a period of time T. The time slot that is allocated for the signal is given by $$T_s = \sum_{i=1}^{D_{Doppler}} T_i,$$

where $T_i$ is the transit time for the Doppler signal i. Thus, the time slot for the noise is $T_n=T-T_s$. If the burst detector triggers on the number of Doppler burst identified by $D_{Processed}$, then the objective is to maximize the number $D_{processed}$ so that this number will be as close as possible to $D_{Doppler}$. To determine how this number can be maximized in the following manner which closely resembles a typical LDV processor, it is preferred that the complete processing system be modeled. If the model for a LDV processor is followed, the signal is first tested by a burst detector to decide on the existence or non existence of the signal. Each time the burst detector is triggered, a record of a certain number of samples which is generally greater than N (N is the number of samples used for burst detection) are acquired to be processed and validated. Let $\tau_p$ be the time required to process and validate the acquired data each time the burst detector is triggered. Therefore, the risk associated with each false detection is that the burst detector and the processor will be masked from detecting and processing real Doppler signals while processing and validating data related to noise. If the quantity $$f_s\left(=\frac{1}{\tau_s}\right)$$

represents the sampling frequency and N samples are used for each attempt for signal detection, the number of burst detector attempts (for the time T) is given by $D_T$ where:

$$D_T = \frac{T}{N\tau_s} \quad (41)$$

and the time required for a single attempt is given by $N\tau_s$.

Out of these $D_T$ attempts, the number of the times the burst detector is triggered by the noise is:

$$D_{noise} = \frac{R(Th)T_n}{N\tau_s} \quad (42)$$

The above quantity follows from the fact that $D_{noise}$ is equal to the number of the burst detector attempts on the noise (which is equal to $$\frac{T_n}{N\tau_s}$$

multiplied by the false detection rate).

Assuming that $D_{noise}$ is sufficiently small, then the time that is required to process the data acquired due to these false triggerings is given by:

$$T_{noise}=D_{noise}\,\tau_p \quad (43)$$

Figure 10A:
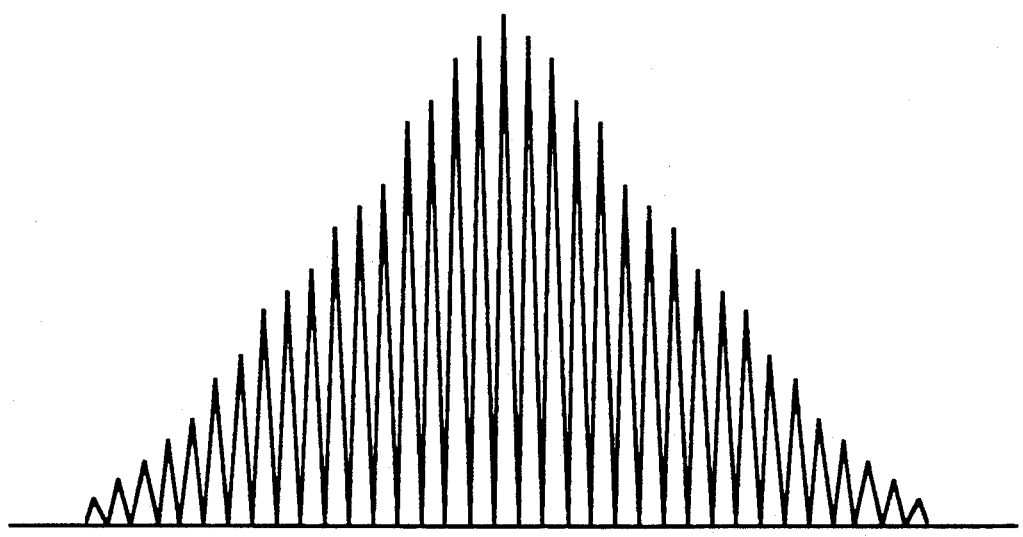
FIG. 10a illustrates a typical Doppler signal and FIG. 10b illustrates a high pass filtered signal.
Figure 10B:
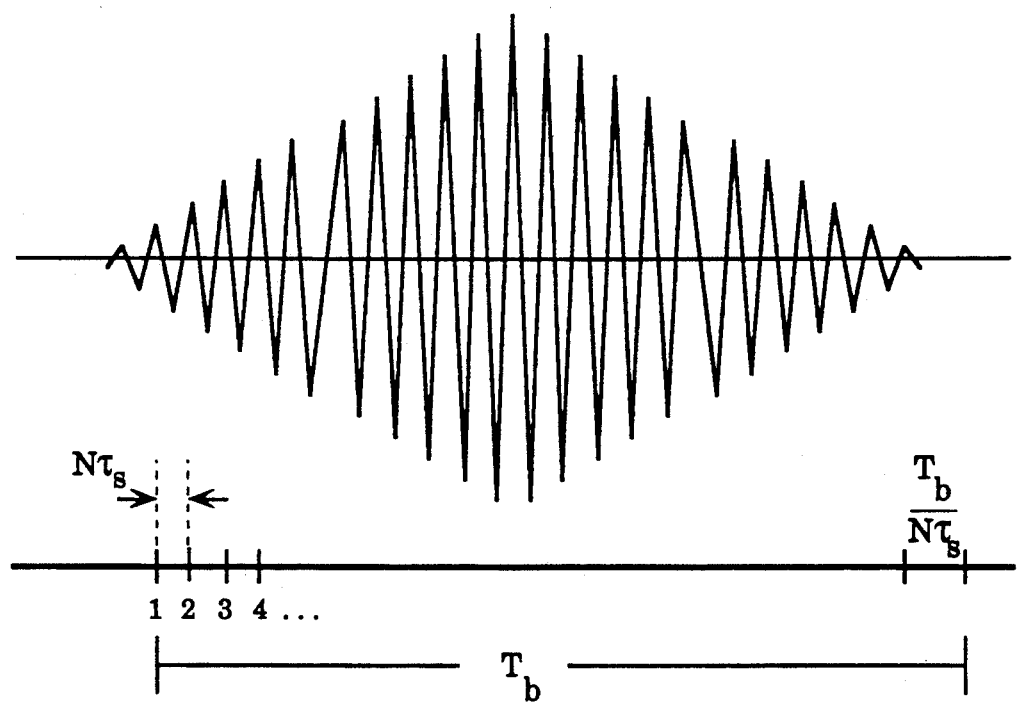

Thus, the time that is left to detect and process real Doppler bursts is given by $T-T_{noise}$ (the previous results hold as far as $D_{noise}$ is small enough such that $T_{noise}$ is less than T). To find the number of the Doppler bursts that trigger the burst detector, the probability of detecting a Doppler burst should be determined. FIG. 10a shows a typical Doppler burst and FIG. 10b shows the burst after filtering to remove the pedestal component. In this figure, $T_b$ represents the expected burst length (or the expected transit time). The number of the attempts by the burst detector is given by $$\alpha = \frac{T_b}{NT_s}.$$

Thus, the probability of detecting a Doppler burst is given by:

$$P[\text{Doppler burst detection}] = 1 - [1 - A(Th, SNR)]^\alpha \quad (44)$$

where A is the acceptance rate which is a function of Th and SNR.

Therefore, the number of the Doppler bursts that are detected by the burst detector (i.e., $D_{Processed}$) per unit time T is given by:

$$D_{Processed} = D_{Doppler}\left[1 - \frac{T_{noise}}{T}\right][1 - \{1 - A(Th, SNR)\}^\alpha] \quad (45)$$

where $\alpha$ is the number of burst detector attempts within the burst.

The objective is to maximize the ratio $$\frac{D_{Processed}}{D_{Doppler}}.$$

As it can be seen from the above equation, this ratio is a complicated function of the threshold, SNR, sampling frequency and the burst length. A simpler criterion has been developed to simplify threshold selection. It is shown in the previous section that if the threshold is chosen to be less than $$2 [N \, G_1(0, \sqrt{2SNR})]^2,$$

then the acceptance rate will be close to one. For this case, the major factor that affects the ratio $$\frac{D_{Processed}}{D_{Doppler}}$$

is the ratio $T_{noise}/T$ (which is dependent on the rejection rate R(Th)). Thus, by choosing the threshold high enough such that ratio $T_{noise}/T \ll 1$ but on the other hand smaller than $$2 [N \, G_1(0, \sqrt{2SNR})]^2,$$

optimum system performance may be obtained.

Thus, the threshold level should be selected to provide an acceptance rate close to one at that SNR. If N=16 and SNR=0, the threshold should not be greater than $$2[16 \, G_1(0, \sqrt{(2)})]^2 = 110$$

to get an acceptance rate close to one at SNR=0 dB. Alternately, the optimum threshold can be empirically determined using the calculated threshold value as the initial value.

For a given threshold of 100, the rejection rate equals 0.016, then for a 5 MHz sampling frequency this rejection rate implies that there will be $$\frac{fs}{16} \, 0.016 = 5000$$

false triggering per second. By utilizing both the in-phase sampler output and the quadrature sampler output, the rejection rate is reduced to $0.016^2 = 2.56 \times 10^{-4}$. This indicates that with 20 MHz sampling frequency, there will be 320 false triggering per second. To lower this number further and to work with higher frequencies and lower SNR's, a decision over two consecutive blocks of 16 samples may be employed. For a threshold value of 100 and a sampling frequency of 160 MHz, the number of false triggering can be lowered to 10 per second.

Figure 11:
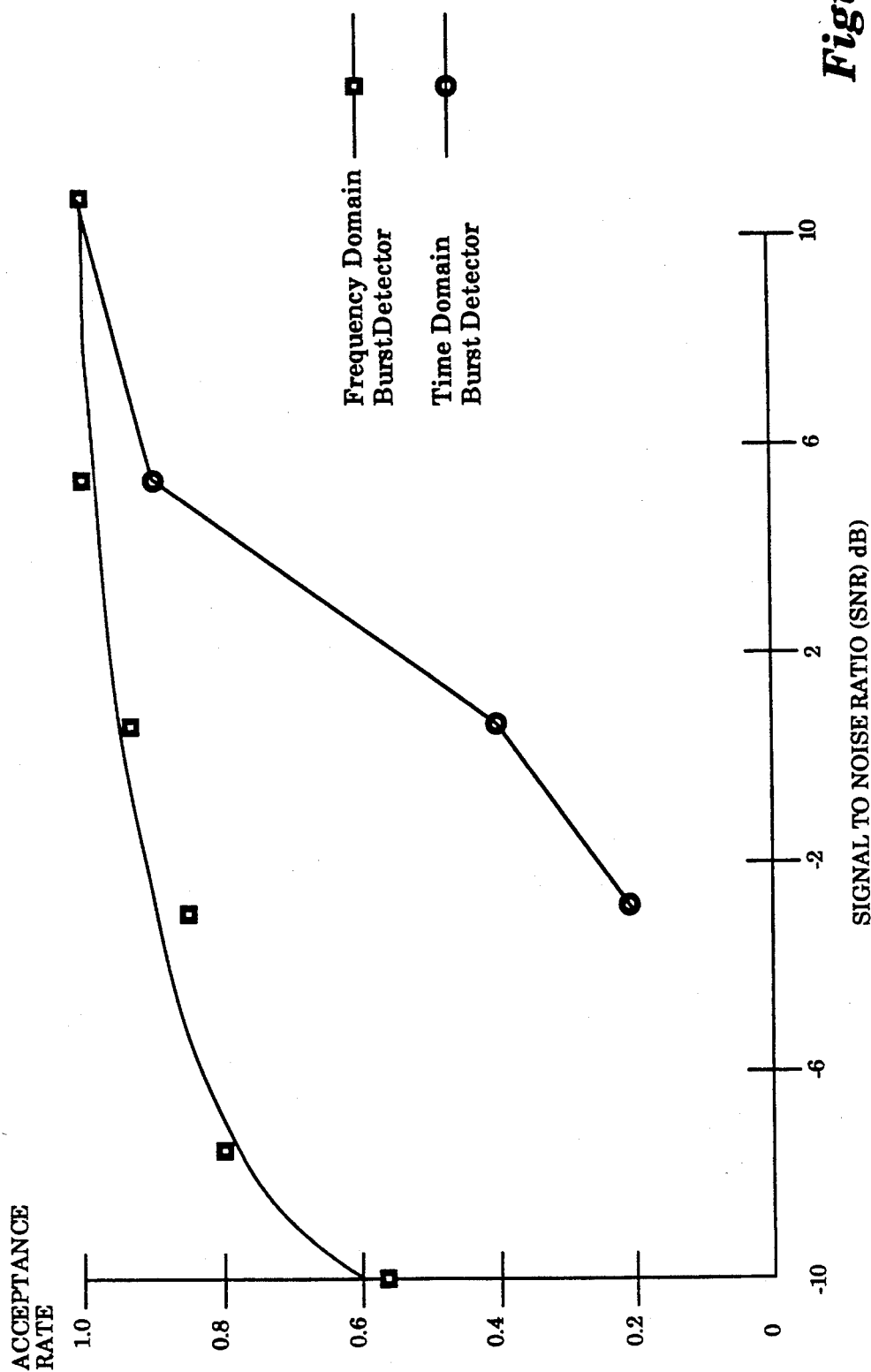
FIG. 11 and FIG. 12 illustrate the performance of the present invention compared to conventional techniques of burst detection.
Figure 12:
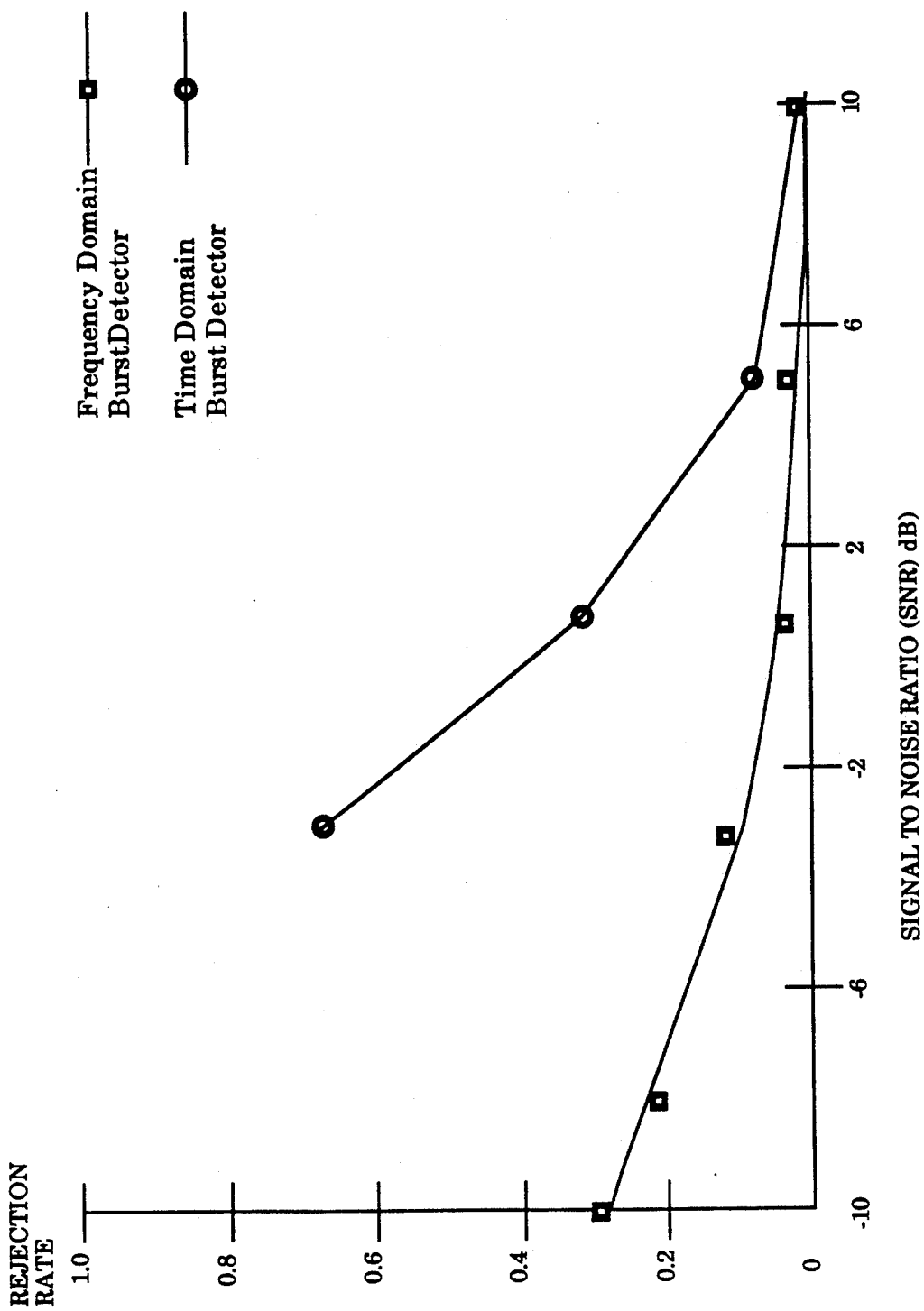

FIG. 11 and FIG. 12 show the performance of the present scheme of burst detection compared to the conventional technique for burst detection. As it can be seen from these figures, a margin of 10 dB is gained using the frequency domain burst detector over the time domain burst detector.

Furthermore, it is preferable to ensure that the burst signal is continuously detected even if the signal to noise ratio varies over the burst and below the threshold level which may occur due to the presence of noise. Once the burst is first detected (i.e., when the signal power exceeds the set threshold), the threshold criteria may be reduced, for example, by 50% of the initial threshold level. This process of reducing the detection criteria ensures that the continuous detection of the remainder of the burst is detected even if the signal to noise ratio varies over the burst signal and power levels of sampled signals go below the higher initial threshold value. The threshold level may then be raised back to detect subsequent bursts.

Preferably, the burst detector of the present invention is utilized to detect the existence of burst signals and is used in conjunction with other apparatus, such as a Doppler Signal Analyzer produced by Aerometrics Inc., Sunnyvale, Calif. which performs a more detailed analysis on the signal. Once a signal is detected, a predetermined number of samples are stored and are utilized to perform analysis regarding the frequency of the signal.

While the invention has been described in conjunction with the preferred embodiment, it is evident that numerous alternatives, modifications, variations and uses will be apparent to those skilled in the art in light of the foregoing description.

We claim:

1. A method for detecting bursts in an input signal, said input signal comprising burst signals and noise, said method comprising the steps of:

encoding the input signal to generate a string of binary values reflective of the input signal;

mapping the encoded signal to known representations of signals, said known representations of signals having precomputed values indicative of the presence of a signal;

determining the existence of a burst signal in the input signal by evaluating the precomputed values associated with each known representation of signals mapped to the encoded signal;

wherein the existence of a burst signal in the presence of noise may be rapidly determined with minimal computational overhead.

2. The method for detecting bursts as set forth in claim 1, wherein the step of encoding the input signal comprises the step of performing an analog to digital conversion of the input signal using one-bit sampling.

3. The method for detecting bursts as set forth in claim 1, further comprising the step of filtering the input signal to remove the pedestal component of the input signal prior to encoding the input signal.

4. The method for detecting bursts as set forth in claim 2, wherein the step of encoding the input signal comprises taking 16 consecutive samples of the input signal.

5. The method for detecting bursts as set forth in claim 1, wherein the step of mapping the encoded signal comprises matching the encoded signal to the known representations of signals.

6. The method for detecting bursts as set forth in claim 1, wherein the precomputed values indicative of the presence of a signal are values indicative of the power of each known representation of a signal.

7. The method for detecting bursts as set forth in claim 1, further comprising the step of generating the precomputed values indicative of the presence of a signal for each representation of a signal by performing a Discrete Fourier Transform (DFT) on each representation, and computing the maximum power value for the each DFT.

8. The method for detecting bursts as set forth in claim 1, wherein the step of determining the existence of a burst signal comprises the step of comparing the precomputed value indicative of the presence of the burst signal to a threshold value, wherein if the precomputed value indicative of the presence of the burst signal is greater than the threshold value, a burst signal is detected.

9. A method for detecting bursts in an input signal, said input signal comprising burst signals and noise, said method comprising the steps of:
   providing a set of reference signals;
   providing a set of predetermined values indicative of the presence of a burst signal, each of the predetermined values corresponding to one reference signal of the set of reference signals;
   sampling the input signal using one-bit quantization;
   mapping the sampled input signal to the set of reference signals to determine the reference signal which most closely matches the sampled input signal;
   evaluating the predetermined value associated with the reference signal which most closely matches the sampled input signal to determine the existence of a burst signal in the input signal;
   wherein the existence of a burst signal in the presence of noise may be rapidly determined with minimal computational overhead.

10. The method for detecting bursts in an input signal as set forth in claim 9, wherein the set of reference signals comprises a set of all possible sampled input signals.

11. The method for detecting bursts in an input signal as set forth in claim 9, wherein the step of providing a set of predetermined values indicative of the presence of a burst signal comprises the steps of generating a quantitative measure for each reference signal of the set of reference signals and determining a value for each quantitative measure.

12. The method for detecting bursts in an input signal as set forth in claim 11, wherein the step of generating a quantitative measure comprises performing a Discrete Fourier Transform (DFT).

13. The method for detecting bursts in an input signal as set forth in claim 12, wherein the step of determining a value for each quantitative measure comprises determining the SNR in the DFT.

14. The method for detecting bursts in an input signal as set forth in claim 9, wherein the step of sampling the input signal produces blocks of 16 bit samples.

15. The method for detecting bursts in an input signal as set forth in claim 14, wherein the set of the sampled input signals comprises the set of all possible 16 bit representations.

16. The method for detecting bursts in an input signal as set forth in claim 9, wherein the step of providing a set of predetermined values indicative of the presence of a burst signal comprises the steps of:
   generating the value indicative of the presence of a burst signal; and
   storing the value indicative of the presence of a burst signal in a memory at an address determinative from the digital value of the reference signal;
   wherein the reference signal is used to locate the value.

17. The method for detecting bursts in an input signal as set forth in claim 16, wherein the step of mapping the sampled input signal to the set of reference signals comprises the step of accessing the memory at the address indicated by the reference signal to determine the predetermined value.

18. The method for detecting bursts in an input signal as set forth in claim 9, wherein the predetermined value associated with the reference signal which most closely matches the sampled input signal is a binary value specifying the existence or nonexistence of a burst signal and the step of evaluating the predetermined value associated with the reference signal which most closely matches the sampled input signal comprises reading the binary value.

19. The method for detecting bursts in an input signal as set forth in claim 9, wherein the step of evaluating the predetermined value associated with the reference signal which most closely matches the sampled input signal comprises the step of comparing the predetermined value associated with the reference signal which most closely matches the sampled input signal to a threshold value, wherein the existence of a burst signal is detected if the predetermined value associated with the reference signal which most closely matches the sampled input signal exceeds the threshold value.

20. The method for detecting bursts in an input signal as set forth in claim 9, further comprising the step of determining the existence of a burst signal in a plurality of contiguous sampled input signals wherein a burst signal is detected if evaluation of the predetermined value which most closely matches the sampled input signal indicates the existence of a burst signal for a predetermined number of contiguous sampled input signals.

21. The method for detecting bursts in an input signal as set forth in claim 9, further comprising the steps of:
   linear transforming the input signal into multiple transformed input signals;
   performing the steps of sampling the input signal, comparing the sampled input signal to the set of reference signals and evaluating the predetermined value associated with the reference signal which most closely matches the sampled input signal with respect to each transformed input signal;

determining the existence of a burst signal if a burst signal was determined to exist in each of the linear transformed input signals.

22. The method for detecting bursts in an input signal as set forth in claim 21, wherein said step of linear transforming the input signal comprises generating an in-phase signal and quadrature signal from the input signal.

23. The method for detecting bursts in an input signal as set forth in claim 19, wherein the threshold value is determined to be a value less than $2[nG_1 (0, SQRT(SNR))]^2$, where n is the number of discrete samples per sampled input signal, G1 is an estimated value of a Gaussian random variable, and SNR represents the signal to noise ratio.

24. The method for detecting bursts in an input signal as set forth in claim 19, further comprising the step of reducing the threshold value after an initial detection of a burst signal in an input signal; and resetting the threshold value after a burst signal is determined not to exist;

wherein once the initial occurrence of a burst signal is detected, continual occurrences of bursts can be easily detected at a lower threshold value avoiding discontinuances of burst signals over multiple contiguous sampled input signals.

25. The method for detecting bursts in an input signal as set forth in claim 16, further comprising the step of reloading the memory with updated values when the threshold value is changed.

26. The method for detecting bursts in an input signal as set forth in claim 16, wherein said memory further comprises information comprising estimates of the frequency of each known representation of the input signal.

27. A burst detector for detecting bursts in an input signal, said input signal comprising burst signals and noise, said burst detector comprising:

encoding means coupled to receive the input signal, said encoding means generating an encoded input signal comprising a string of binary values representative of the input signal;

a memory comprising a set of known representations of signals and precomputed values indicative of the presence of a burst signal in each representation of a signal;

mapping means for mapping the encoded input signal to a known representation of a signal;

evaluation means for determining the presence of a burst signal according to the precomputed value indicative of the presence of a burst signal for the mapped known representation of a signal;

wherein the existence of a burst signal in the input signal in the presence of noise may be rapidly determined with minimal computational overhead.

28. The burst detector as set forth in claim 27, wherein said encoding means comprises a means for performing 1-bit quantization.

29. The burst detector as set forth in claim 28, wherein said means for performing comprises a one bit analog to digital converter.

30. The burst detector as set forth in claim 28, wherein said encoding means comprises a means for detecting the local minimums and local maximums of an input signal, said means generating a binary value for each local minimum and local maximum.

31. The burst detector as set forth in claim 27, wherein the string of binary values comprises a 16 bit sample of the input signal.

32. The burst detector as set forth in claim 27, further comprising a linear transformation means to linear transform the input signal to generate multiple linear transformed input signals;

wherein each linear transformed input signal of the input signal is encoded, mapped and evaluated and a burst signal is determined to exist in the input signal if a burst signal is evaluated to be present in the multiple linear transformed input signals 33. The burst detector as set forth in claim 32, wherein said linear transformation means comprises:

a first mixer coupled to receive the input signal for generating a in-phase input signal a phase shifter coupled to receive the local oscillator output for shifting the phase of the input signal by 90 degrees;

a second mixer coupled to receive the output of the phase shifter for generating a quadrature input signal.

34. The burst detector as set forth in claim 27, wherein said encoding means generates a string of binary values of a predetermined length and said set of known representations of signals comprises all possible variations of strings of binary values of the predetermined length, said mapping means matching the string of binary values representative of the input signal to a known representation of a signal.

35. The burst detector as set forth in claim 27, wherein each of said precomputed values indicative of the presence of a burst signal is stored in the memory at an address determined from the corresponding known representation of a signal.

36. The burst detector as set forth in claim 35, wherein said mapping means retrieves the precomputed value located at an address specified by the encoded input signal.

37. The burst detector as set forth in claim 27, wherein the precomputed values indicative of the presence of a signal are values indicative of the SNR of each of the known representations of a signal.

38. The burst detector as set forth in claim 27, further comprising a means for generating the precomputed values indicative of the presence of a signal which performs a Discrete Fourier Transform (DFT) on each representation of a signal, and computes the maximum power value for the each DFT.

39. The method for detecting bursts as set forth in claim 27, wherein said evaluation means comprises a comparator means for comparing the precomputed value indicative of the presence of the burst signal to a threshold value, wherein if the precomputed value indicative of the presence of the burst signal is greater than the threshold value, a burst signal is detected.

40. A burst detector for detecting bursts in an input signal, said input signal comprising burst signals and noise, said burst detector comprising:

linear transformation means for linear transforming said input signal into an in-phase and quadrature signal;

a one bit analog to digital (A/D) converter coupled to receive the in-phase and quadrature signal, said one bit A/D converter generating an encoded in-phase signal and encoded quadrature signal each encoded signal comprising a string of binary values of a predetermined length representative of the input signal;

a memory comprising precomputed values indicative of the presence of a burst signal for all possible combinations of a string of binary values of the predetermined length, said precomputed values stored in the memory at addresses determinative from the encoded signal's string of binary values;

evaluation means reading the memory at the address determinative from the encoded signal and determining the presence of a burst signal according to the precomputed value indicative of the presence of a burst signal read from memory;

wherein the existence of a burst signal in the input signal in the presence of noise may be rapidly determined with minimal computational overhead.

41. The burst detector as set forth in claim 40, further comprising a means for generating precomputed values indicative of the presence of a burst signal comprising:

Discrete Fourier Transform (DFT) means for generating a DFT for each known representation of input signal of the set of known representations of input signals;

means for generating a maximum power value for each DFT.

42. The burst detector as set forth in claim 40, further comprising:

a comparator means for comparing the maximum power value in the DFT for each known representation of an input signal to a threshold value indicative of the presence of a burst signal; and means for generating a precomputed value to be a single bit indicative of whether the maximum power value exceeds the threshold value;

wherein the single bit value is stored in the memory.

43. The burst detector as set forth in claim 40, wherein said maximum power value for each known representation of a signal is stored in the memory and said evaluation means further comprises a comparator for comparing the maximum power value read from memory to a threshold value indicative of the preswnce of a burst signal, wherein a burst signal is determined to exist if the maximum power value exceeds the threshold value.

44. The burst detector as set forth in claim 43, wherein information comprising estimates of the frequency of each known representation of the input signal is stored in the memory.

* * * * *

UNITED STATES PATENT AND TRADEMARK OFFICE
CERTIFICATE OF CORRECTION

PATENT NO. : 5,289,391
DATED : 2/22/94
INVENTOR(S) : Ibrahim et al.

It is certified that error appears in the above-indentified patent and that said Letters Patent is hereby corrected as shown below:

Column 2, Line 50; Delete "s(t) + (t))"; Inset in place thereof -- s(t) + n(t)--

Column 3, Line 25; Delete "sin (2]"; Insert in place thereof -- sin(2π--

Column 4, Line 5; Delete "No"; Insert in place thereof --N$_\sigma$--

Column 5, Line 27; Delete "4N "; Insert in place thereof --4N$_\sigma^2$--

Column 8, Line 32; Delete "(1')"; Insert in place thereof --(1's)--

Column 11, Line 30; Delete "N/Th"; Insert in place thereof -- Th/N--

Column 11, Line 55; Delete "sign$^y$"; Insert in place thereof -- sign--

Column 12, Line 22; Delete "G94 (Oa)"; Insert in place thereof --G$_\delta$(O,a)--

Signed and Sealed this

Twelfth Day of September, 1995

BRUCE LEHMAN

Attest:

Attesting Officer

Commissioner of Patents and Trademarks